(12) United States Patent
Lee

(10) Patent No.: US 8,044,302 B2
(45) Date of Patent: Oct. 25, 2011

(54) PRINTED CIRCUIT BOARD HAVING COPLANAR LC BALANCE

(75) Inventor: Jong-Joo Lee, Gyeonggi-do (KR)

(73) Assignee: Samsung Electronics Co., Ltd., Maetan-dong, Yeongtong-gu, Suwon-si, Gyeonggi-do (KR)

( * ) Notice: Subject to any disclaimer, the term of this patent is extended or adjusted under 35 U.S.C. 154(b) by 1001 days.

(21) Appl. No.: 11/945,874

(22) Filed: Nov. 27, 2007

(65) Prior Publication Data
US 2008/0142248 A1    Jun. 19, 2008

(30) Foreign Application Priority Data

Dec. 19, 2006  (KR) .......................... 10-2006-0130451

(51) Int. Cl.
*H05K 1/03* (2006.01)
(52) U.S. Cl. ......................................... 174/255; 174/261
(58) Field of Classification Search .................. 174/254, 174/255, 260, 261
See application file for complete search history.

(56) References Cited

U.S. PATENT DOCUMENTS

| 6,462,423 B1 * | 10/2002 | Akram et al. ................. 257/778 |
| 7,259,467 B2 * | 8/2007 | Inagawa ........................ 257/784 |
| 7,361,846 B2 * | 4/2008 | Chiang et al. ................. 174/260 |

FOREIGN PATENT DOCUMENTS

| JP | 11-220056 | 8/1999 |
| JP | 2000-100814 | 4/2000 |
| JP | 2001-127385 | 5/2001 |

OTHER PUBLICATIONS

English language abstract of Japanese Publication No. 11-220056.
English language abstract of Japanese Publication No. 2000-100814.
English language abstract of Japanese Publication No. 2001-127385.

* cited by examiner

*Primary Examiner* — Ishwarbhai Patel
(74) *Attorney, Agent, or Firm* — Muir Patent Consulting, PLLC

(57) ABSTRACT

Provided is a printed circuit board having coplanar LC balance, comprising: an insulation layer, printed circuit patterns formed on the insulation layer, power source wirings supplying power in the printed circuit patterns, and at least three signal wirings formed between the power source wirings, wherein widths of signal wirings far from the power source wirings are wider than widths of signal wirings adjacent to the power source wirings to achieve LC balance, thereby reducing the skew between signal wirings and improving the quality of signal transfer.

19 Claims, 3 Drawing Sheets

PRINTED CIRCUIT BOARD HAVING COPLANAR LC BALANCE

CROSS-REFERENCE TO RELATED PATENT APPLICATION

This application claims priority under 35 USC §119 to Korean Patent Application No. 10-2006-130451, filed on Dec. 19, 2006 in the Korean Intellectual Property Office, the disclosure of which is incorporated herein in its entirety by reference.

BACKGROUND

1. Technical Field

The present invention relates to a printed circuit board, and more particularly, to a printed circuit board that has coplanar LC balance by differentiating the widths of signal wirings that can be used in semiconductor packages and module boards, and also as a mother board.

2. Description of the Related Art

A developing trend in semiconductor devices and consumer electronics including the same is the pursuit of higher speed, higher performance and smaller size based on a high degree of integration. To achieve high speed, the quality of digital signals on a communication channel must be high. Further, a minimum amount of skew is desired in communication channels having the same function among several communication channels in the devices. As used here, skew refers to a difference in signal transfer delay time generated in communication channels having the same function.

To minimize skew in semiconductor devices and consumer electronics, an interconnect wiring formed by communication channels and pins in the devices should be formed so that a loop inductance, which is an L component, and a self capacitance, which is a C component, can be matched to achieve LC balance. Conventionally, LC balance is achieved using a transmission line structure such as a microstrip, a strip-line, a coplanar waveguide, etc.

However, LC balance according to conventional techniques inevitably increases the number of metal wiring layers of a printed circuit board used in the semiconductor devices and consumer electronics or the area of the printed circuit board. In contrast, in line with the recent development trend for semiconductor devices and consumer electronics, the number of metal wiring layers of a printed circuit board and/or the area of the printed circuit board should be reduced as much as possible. Accordingly, recent printed circuit boards include various interconnect wiring topologies besides a point-to-point connection. Therefore, more than three signal wirings may be arranged between power source wirings in an interconnect wiring on a coplanar printed circuit pattern.

Particularly, in the case of a printed circuit board of DRAM semiconductor packages having a board on chip (BOC) structure, all interconnect wirings are formed in a printed circuit board having a single-layer structure. Thus, signal wirings for command and address and power source wirings are formed adjacent to each other. Also, semiconductor packages using a printed circuit board having a multi-layer structure can also have a structure in which signal wirings for command and address and power source wirings can be formed adjacent to each other.

In this case, LC balance cannot be achieved only by adjusting the length of interconnect wirings because adjacent signal wirings and power source wirings affect each other during operation of the semiconductor package.

The present invention addresses these and other disadvantages of the conventional art.

SUMMARY

To solve the above-described problems, the present invention provides a printed circuit board in which coplanar LC balance is achieved to generate minimum skew by improving shapes of interconnect wirings of the printed circuit board.

According to some embodiments of the present invention a printed circuit board having coplanar LC balance comprises: an insulation layer; printed circuit patterns disposed on the insulation layer; power source wirings supplying power in the printed circuit patterns; at least three signal wirings disposed between the power source wirings, wherein widths of the signal wirings far from the power source wirings are larger than widths of the signal wirings adjacent to the power source wirings to achieve LC balance.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 1:
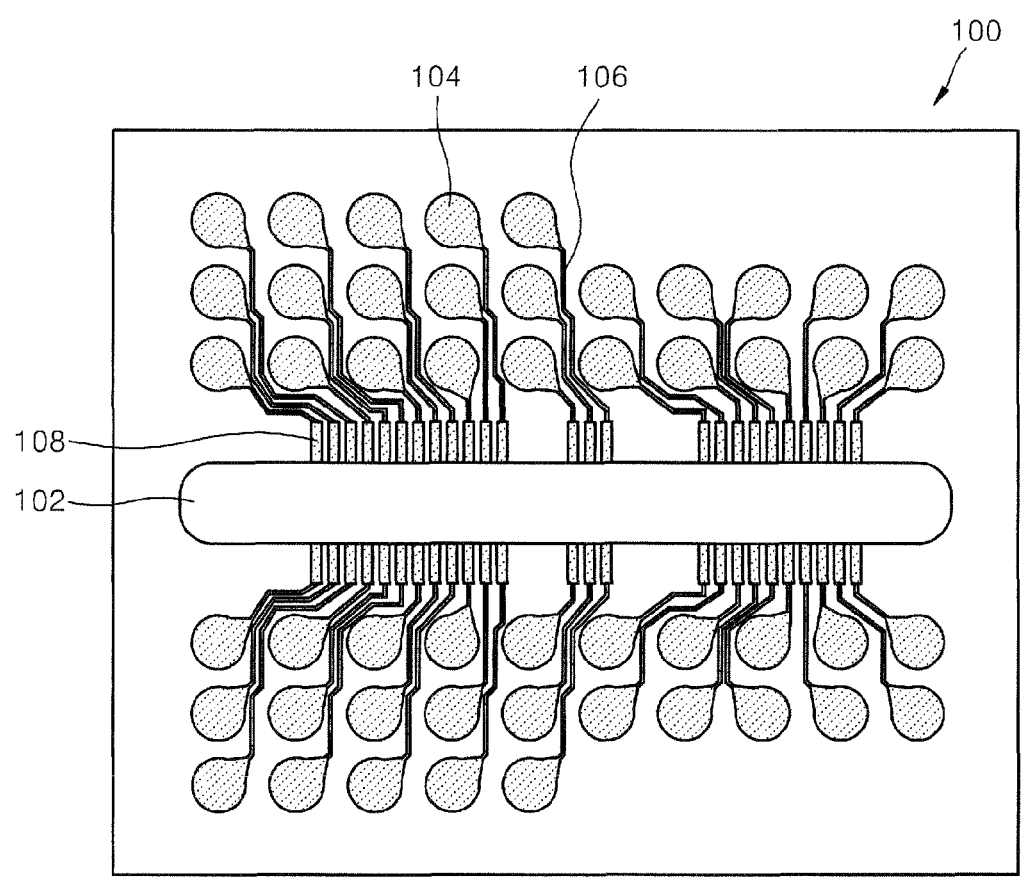
FIG. 1 is a plan view illustrating a printed circuit board according to an embodiment of the present invention.

FIG. 1 is a plan view illustrating a printed circuit board 100 having a board on chip (BOC) structure, according to an embodiment of the present invention.

Referring to FIG. 1, a slit 102 for wire bonding with a semiconductor chip is formed in the center of the printed circuit board 100. A plurality of printed circuit patterns such as solder ball lands 104, interconnect wirings 106, bond fingers 108, etc., are formed in a single-layer structure. Accordingly, the interconnect wirings 106, including signal wirings and power source wirings, are all formed in a small planar space. Since many interconnect wirings 106 are formed in a small space, more than three signal wirings, including a command signal wiring or an address signal wiring, can be interposed between power source wirings. According to conventional techniques, the widths of signal wirings formed between the power source wirings are identical, and thus it is difficult to achieve effective LC balance.

Figure 2:
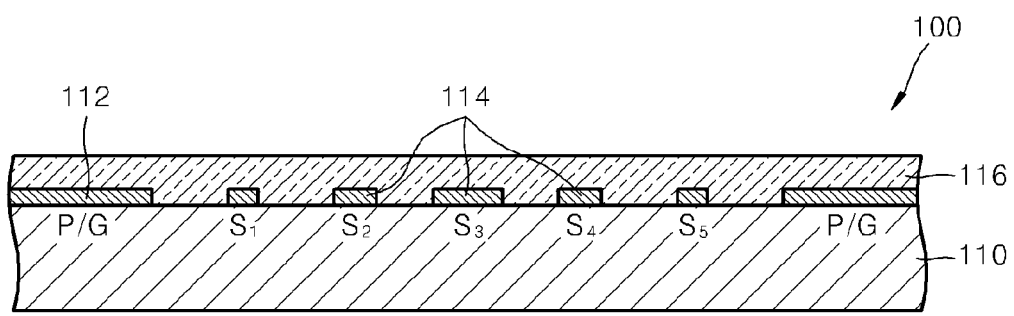
FIG. 2 is a cross-sectional view of a printed circuit board that has LC balance according to an embodiment of the present invention.

FIG. 2 is a cross-sectional view illustrating the printed circuit board 100 in which five signal wirings 114 ($S_1$, $S_2$, $S_3$, $S_4$ and $S_5$) are formed between power source wirings 112, including P/G, to achieve LC balance according to the current embodiment. The power source wirings 112 may be power wirings or ground wirings, and the signal wirings may be command signal wirings or address signal wirings of semiconductor devices such as a DRAM.

The widths of the signal wirings 114 formed between the power source wirings 112 in the printed circuit board 100 are different from each other according to an embodiment of the present invention. The width of the signal wiring S3 far from the power source wirings 112 is larger than the width of the signal wirings S1 and S5 adjacent to the power source wirings 112.

The width of the signal wiring S3 can be determined by taking into consideration the distance from the power source wirings 112 and the distance to the adjacent signal wirings 114. Therefore, the width of the signal wiring S3 is the largest and the widths of the signal wirings S2 and S4 are larger than those of the signal wirings S1 and S5.

Thus, the signal wiring S3 may be formed to have the largest width as allowed by the distances to the adjacent signal wirings S2 and S4, and the signal wirings S1 and S5 may be formed to have the smallest width. Compared to the conventional signal wirings having identical widths, this formation of the signal wirings 114 is helpful for achieving capacitance balance and inductance balance. In general, the capacitance is inversely proportional to the distance between metals of a printed circuit pattern and directly proportional to the cross-sectional area between the metals of the printed circuit pattern. Therefore, the capacitances of S1 and S5 are larger when the distance of S1 and S5 to the power source wirings 112 is shorter. According to the present invention, capacitance can be compensated by forming the widths of the signal wirings 114 far from the power source wirings 112 large and thereby increasing the capacitances of S2, S3 and S4.

Meanwhile, a loop inductance L relating to signal delay in the operation of the printed circuit board 100 is determined as the sum of self inductances of metals such as the power source wiring 112 and the signal wiring 114 minus two times the mutual inductance between the metals. Each of the self inductances of the power wiring 112 and the signal wiring 114 is inversely proportional to the area and the mutual inductance is inversely proportion to the distance. Therefore, the signal wirings relatively far from the power source wiring 112 such as the signal wiring S3 have a smaller mutual inductance, and thus have a greater loop inductance than the signal wirings relatively close to the power source wirings 112 such as the signal wirings S1 or S5. Consequently, the self inductance of the signal wiring S3 far from the power source wirings 112 is reduced by forming the width thereof relatively large. Thus, an overall loop inductance is balanced by compensating for relatively low mutual inductances of the signal wirings such as S3.

As a result, LC balance can be achieved and thus the skew between interconnect wirings formed in the printed circuit board 100 can be minimized by forming the width of the signal wirings S3 far from the power source wirings 112 larger than that of the signal wirings St adjacent to the power source wirings 112.

Figure 3:
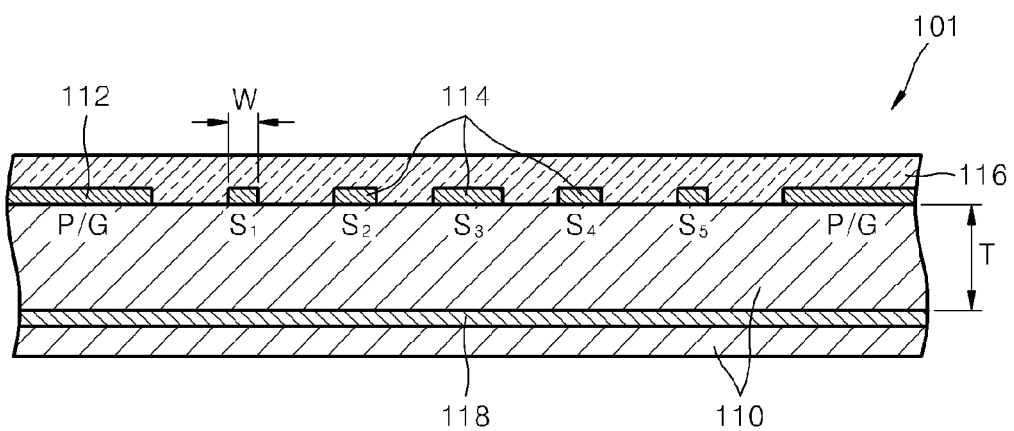
FIG. 3 is a cross-sectional view of a printed circuit board that has LC balance according to another embodiment of the present invention.

FIG. 3 is a cross-sectional view of a printed circuit board 101 that has LC balance according to another embodiment of the present invention.

Referring to FIG. 3, the printed circuit board 101 has a multi-layer structure, whereas the printed circuit board 100 of FIG. 2 has a single-layer structure. In general, in the case of a printed circuit board having a multi-layer structure such as the printed circuit board 101, LC imbalance can be solved by forming a lower layer 118 as a power source wiring. However, when the thickness T of an insulation layer 110 interposed between printed circuit patterns in a multi-layer structure is greater than the width W of the minimum width of signal wiring or when the dielectric constant of the insulation layer 110 is smaller than 3.5, the LC imbalance between the signal wirings 114 and the power source wirings 112 of the printed circuit patterns disposed on the same plane of the upper layer increases.

In this case, the skew between interconnect wirings formed on the printed circuit board 101 can be minimized by achieving LC balance by forming the signal wiring S3, which is far from the power source wirings 112, wider than the signal wiring S1, which is adjacent to the power source wirings 112.

Figure 4:
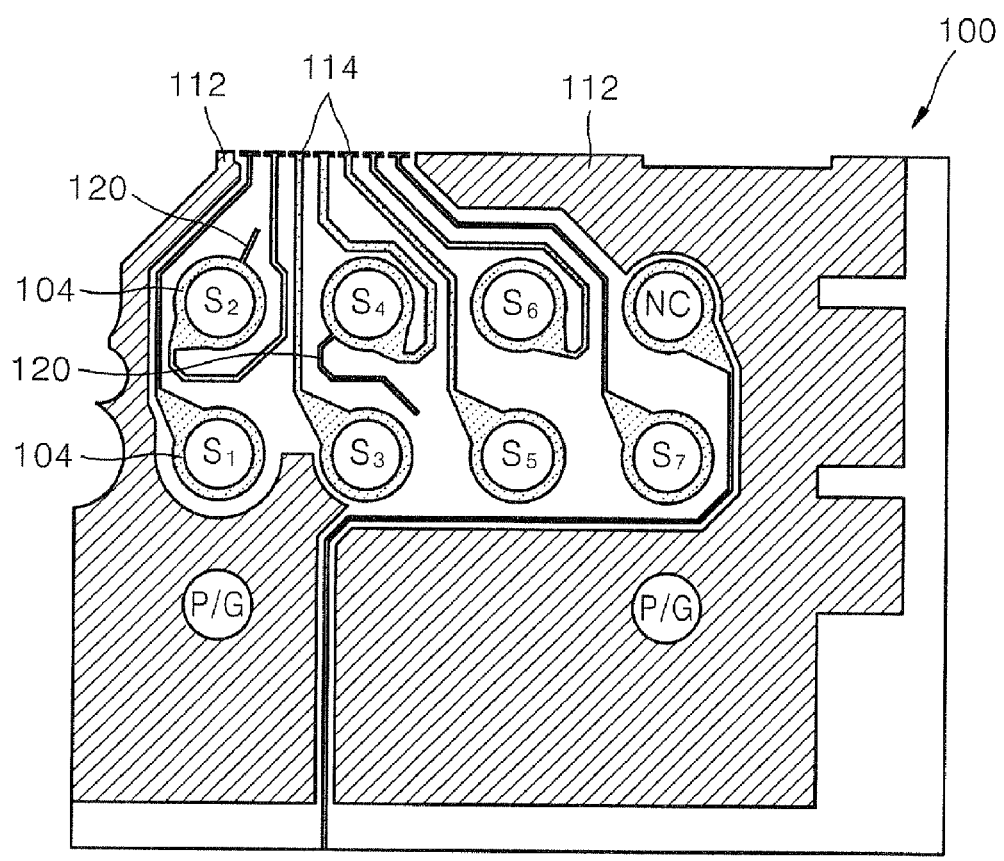
FIG. 4 is a plan view illustrating shapes of solder ball lands formed in a printed circuit board that has LC balance according to another embodiment of the present invention.

FIG. 4 is a plan view illustrating the shape of the solder ball lands 104 formed in the printed circuit board 100 to achieve LC balance according to another embodiment of the present invention.

In the printed circuit board 100 including the solder ball land 104, the area of the solder ball lands 104 is relatively large and accordingly the area for forming the interconnect wirings 106 of FIG. 1 becomes small. Therefore, forming all of the interconnect wirings 106 to have the same length in the printed circuit board 100 is difficult.

In FIG. 4, the lengths of the interconnect wirings are not equal to one another.

The printed circuit board 100 according to the current embodiment includes an insulation layer, printed circuit patterns formed on the insulation layer, the power source wirings 112 supplying power in the printed circuit board, at least three signal wirings 114 formed on the same plane as and between the power source wirings 112 and the solder ball lands 104 (S1 through S7) connected to the power source wirings 112 and the signal wirings 114 in the printed circuit patterns. The solder ball lands S2 and S4 have shorter wirings compared to other solder ball lands and thus have a tail-like additional wiring 120 on one end to achieve LC balance. Here, the wirings are short compared to other signal wirings and thus it is hard to limit them to a certain range because the length can change depending on the size of printed circuit board 100.

The additional tail wirings 120 function as capacitance loading in the printed circuit board 100 but not as inductance loading in driving each signal wiring 114. Therefore, inductance balance is adjusted according to the distance of each signal wiring from the power source wirings 112 and capacitance loading is compensated for the short signal wirings S2 and S4 by forming the additional tail wirings 120.

The additional tail wirings 120 can have a straight line shape, a curve shape, or a coil shape. Also, the length of the additional tail wirings 120 may be smaller than ¹⁄₂₀ of the wavelength of an access time of a semiconductor device mounted on the printed circuit board. For example, when a semiconductor device having a driving speed of 1 GHz is installed on the printed circuit board, the wavelength of access time of the semiconductor device is 15 cm. Therefore, the additional tail wirings 120 may be formed to be shorter than 0.75 cm. Also, the additional tail wirings 120 may be formed without tapering and may be formed to have a width not less than the minimum width of printed circuit patterns.

Consequently, the LC balance effect can be increased by forming the signal wirings S4, which are far from the power source wirings 112, wider than the signal wirings S1 and S7, which are adjacent to the power source wirings, in conjunction with forming the additional tail wirings 120 onto the solder ball lands 104 having relatively short signal wirings S2 and S4.

By adjusting the widths of signal wirings formed on the same plane as and between power source wirings of a printed circuit board and changing the structures of the solder ball lands connected to the signal wirings according to the embodiments of the present invention, firstly, skew can be minimized by achieving LC balance, secondly, noise due to cross-talk in a printed circuit board and noise related to power source wirings can be reduced, and lastly, a high speed driving feature can be improved even in small low-priced printed circuit boards. Also, although solder ball lands have been specifically described above, the lands are capable of receiving any type of external connection terminal, such as an anisotropic conductive film or the like.

According to some embodiments of the present invention a printed circuit board having coplanar LC balance comprises: an insulation layer; printed circuit patterns disposed on the insulation layer; power source wirings supplying power in the printed circuit patterns; at least three signal wirings disposed between the power source wirings, wherein widths of the signal wirings far from the power source wirings are larger than widths of the signal wirings adjacent to the power source wirings to achieve LC balance.

The printed circuit board can be used in semiconductor packages having a BOC structure, in semiconductor packages having a BGA structure, in a memory module board of a semiconductor memory module, or as a mother board for electronic devices.

The printed circuit patterns can be in a single-layer structure, or in a multi-layer structure. When the printed circuit patterns are in a multi-layer structure, the thickness of the insulation layer interposed between the multi-layer printed circuit patterns may be greater than the minimum width of the printed circuit patterns, or the dielectric constant of the insulation layer interposed between the multi-layer printed circuit patterns may be smaller than 3.5.

The signal wirings may be address signal wirings or command signal wirings of semiconductor memory devices.

According to another aspect of the present invention, there is provided a printed circuit board having LC balance, comprising: an insulation layer; printed circuit patterns disposed on the insulation layer; power source wirings supplying power in the printed circuit patterns; at least three signal wirings disposed between the power source wirings in the printed circuit patterns; and a plurality of external connection terminal lands connected to the power source wirings and signal wirings in the printed circuit patterns, wherein an additional tail wiring is formed on one end of the external connection terminal land that is connected to a shorter wiring of the at least three signal wirings.

The additional tail wiring may have one of a straight line shape, a curve shape, and a coil shape.

The length of the additional tail wiring may be less than 1/20 of the wavelength of an access time of a semiconductor device mounted on the printed circuit board, and the width of the additional tail wiring may be less than or equal to the minimum width of the printed circuit patterns.

Widths of signal wirings far from the power source wirings may be greater than widths of signal wirings adjacent to the power source wirings.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A printed circuit board having coplanar LC balance, comprising:
   an insulation layer;
   printed circuit patterns disposed on the insulation layer;
   power source wirings supplying power in the printed circuit patterns;
   at least three signal wirings disposed on the same plane as and between the power source wirings,
   wherein widths of the signal wirings farther from the power source wirings are larger than widths of the signal wirings closer to the power source wirings to achieve LC balance.

2. The printed circuit board of claim 1, wherein the power source wirings are power wirings or ground wirings.

3. The printed circuit board of claim 1, wherein the signal wirings are address signal wirings or command signal wirings of semiconductor devices.

4. The printed circuit board of claim 1, wherein the printed circuit board is used in semiconductor packages having a BOC structure.

5. The printed circuit board of claim 1, wherein the printed circuit board is used in semiconductor packages having a BGA structure.

6. The printed circuit board of claim 1, wherein the printed circuit board is used in a memory module board of a semiconductor memory module.

7. The printed circuit board of claim 1, wherein the printed circuit board is used as a mother board for electronic devices.

8. The printed circuit board of claim 1, wherein the printed circuit patterns further comprise a plurality of external connection terminal lands which are connected to the power source wirings and the signal wirings.

9. The printed circuit board of claim 8, wherein the external connection terminal land that is connected to a signal wiring far from the power source wiring has an additional tail wiring on one end thereof.

10. The printed circuit board of claim 1, wherein the printed circuit patterns are in a single-layer structure.

11. The printed circuit board of claim 1, wherein the printed circuit patterns are in a multi-layer structure.

12. The printed circuit board of claim 11, wherein a thickness of the insulation layer interposed between the multi-layer printed circuit patterns is greater than a minimum width of the printed circuit patterns.

13. The printed circuit board of claim 11, wherein a dielectric constant of the insulation layer interposed between the multi-layer printed circuit patterns is smaller than 3.5.

14. A printed circuit board having LC balance, comprising:
   an insulation layer;
   printed circuit patterns disposed on the insulation layer;
   power source wirings supplying power in the printed circuit patterns;
   at least three signal wirings disposed on the same plane as and between the power source wirings in the printed circuit patterns; and
   a plurality of external connection terminal lands connected to the power source wirings and signal wirings in the printed circuit patterns, wherein an additional tail wiring is disposed on one end of the external connection terminal land that is connected to a shorter wiring of the at least three signal wirings, and wherein widths of signal wirings far from the power source wirings are greater than widths of signal wirings adjacent to the power source wirings.

15. The printed circuit board of claim 14, wherein the printed circuit patterns are in a single-layer structure.

16. The printed circuit board of claim 14, wherein the printed circuit patterns are in a multi-layer structure.

17. The printed circuit board of claim 14, wherein the additional tail wiring has one of a straight line shape, a curve shape, and a coil shape.

18. The printed circuit board of claim 14, wherein a length of the additional tail wiring is less than $1/20$ of the wavelength of an access time of a semiconductor device mounted on the printed circuit board.

19. The printed circuit board of claim 14, wherein a width of the additional tail wiring is less than or equal to a minimum width of the printed circuit patterns.

* * * * *